United States Patent
Dix et al.

(10) Patent No.: US 10,326,013 B2
(45) Date of Patent: Jun. 18, 2019

(54) METHOD OF FORMING A FIELD-EFFECT TRANSISTOR (FET) OR OTHER SEMICONDUCTOR DEVICE WITH FRONT-SIDE SOURCE AND DRAIN CONTACTS

(71) Applicant: Microchip Technology Incorporated, Chandler, AZ (US)

(72) Inventors: Greg Dix, Tempe, AZ (US); Jina Shumate, Phoenix, AZ (US); Eric Peterson, Tempe, AZ (US); Rajesh Nayak, Phoenix, AZ (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 0 days.

(21) Appl. No.: 15/819,822

(22) Filed: Nov. 21, 2017

(65) Prior Publication Data

US 2018/0145170 A1    May 24, 2018

Related U.S. Application Data

(60) Provisional application No. 62/426,216, filed on Nov. 23, 2016.

(51) Int. Cl.
*H01L 29/78* (2006.01)
*H01L 29/66* (2006.01)
(Continued)

(52) U.S. Cl.
CPC ...... *H01L 29/7809* (2013.01); *H01L 29/0696* (2013.01); *H01L 29/1095* (2013.01);
(Continued)

(58) Field of Classification Search
CPC .......... H01L 29/7809; H01L 29/41766; H01L 29/7828; H01L 29/66666; H01L 29/4236;
(Continued)

(56) References Cited

U.S. PATENT DOCUMENTS

| 8,361,865 B2 | 1/2013 | Kobayashi | 438/270 |
| 8,598,655 B1 | 12/2013 | Schloesser et al. | 257/334 |

(Continued)

FOREIGN PATENT DOCUMENTS

| EP | 2096667 A2 | 9/2009 | H01L 21/304 |
| EP | 2096677 A2 | 9/2009 | H01L 21/336 |

OTHER PUBLICATIONS

International Search Report and Written Opinion, Application No. PCT/US2017/063104, 14 pages, dated Mar. 12, 2018.
(Continued)

*Primary Examiner* — Laura M Menz
*Assistant Examiner* — Candice Chan
(74) *Attorney, Agent, or Firm* — Slayden Grubert Beard PLLC (57) ABSTRACT

A method is provided for forming an integrated circuit (IC) structure including trench-based semiconductor devices, e.g., trench FETs, having front-side drain contacts. The method may include forming an epitaxy region, forming a poly gate trench in the epitaxy region, forming a drain contact trench through the poly gate trench and extending below the poly gate trench, forming a poly gate in the poly gate trench, forming a front-side drain contact in the drain contact trench, and forming a source region in the epitaxy region adjacent the poly gate. The device may define a drift region from the poly gate/source intersection to the front-side drain contact. The drift region may be located within the epitaxy layer, without extending into an underlying substrate or transition layer. The front-side drain contact depth may be selected to influence the device breakdown voltage. The front-side drain contacts may allow flip-chip mounting of the IC structure.

9 Claims, 12 Drawing Sheets

(51) Int. Cl.
  *H01L 29/10*    (2006.01)
  *H01L 29/06*    (2006.01)
  *H01L 29/417*   (2006.01)
  *H01L 29/423*   (2006.01)

(52) U.S. Cl.
  CPC .... *H01L 29/41766* (2013.01); *H01L 29/4236* (2013.01); *H01L 29/66666* (2013.01); *H01L 29/66734* (2013.01); *H01L 29/7813* (2013.01); *H01L 29/7828* (2013.01)

(58) Field of Classification Search
  CPC ............. H01L 29/0696; H01L 29/1095; H01L 29/7813; H01L 29/66734
  See application file for complete search history.

(56) References Cited

U.S. PATENT DOCUMENTS

| | | | |
|---|---|---|---|
| 2007/0032029 A1* | 2/2007 | Chow ................... | H01L 27/088 438/330 |
| 2007/0166925 A1 | 7/2007 | Takeda et al. ................ | 438/270 |
| 2008/0142880 A1* | 6/2008 | Blanchard ........... | H01L 29/0634 257/328 |
| 2012/0068231 A1 | 3/2012 | Garnett ......................... | 257/263 |
| 2012/0168819 A1 | 7/2012 | Marino et al. ................ | 257/192 |
| 2013/0334601 A1 | 12/2013 | Dong et al. ................... | 257/339 |
| 2014/0167144 A1 | 6/2014 | Tsuchiko ...................... | 257/329 |

OTHER PUBLICATIONS

International Search Report and Written Opinion, Application No. PCT/US2017/063085, 13 pages, dated Mar. 7, 2018.

* cited by examiner

METHOD OF FORMING A FIELD-EFFECT TRANSISTOR (FET) OR OTHER SEMICONDUCTOR DEVICE WITH FRONT-SIDE SOURCE AND DRAIN CONTACTS

RELATED PATENT APPLICATION

This application claims priority to commonly owned U.S. Provisional Patent Application No. 62/426,216; filed Nov. 23, 2016; which is hereby incorporated by reference herein for all purposes.

TECHNICAL FIELD

The present disclosure relates to semiconductor devices, e.g., field-effect transistors (FETs) and, more particularly, to a method of forming trench-type semiconductor devices, e.g., trench FETs having front-side drain contacts.

BACKGROUND

Processes for forming transistors include creating split-trench transistors, wherein the gate structure inside the trench is split into two segments. Trench-based transistors include field-effect transistors (FETs) such as power MOSFETs. Transistors formed using trenches may include gate electrodes that are buried in a trench etched in the silicon. This may result in a vertical channel. In many such FETs, the current may flow from front side of the semiconductor die to the back side of the semiconductor die. Transistors formed using trenches may be considered vertical transistors, as opposed to lateral devices.

Trench FET devices may allow better density through use of the trench feature. However, trench FET devices may suffer from packaging issues when used in modules and devices. Furthermore, a thin back grind is typically required to use such trench devices.

Figure 1:
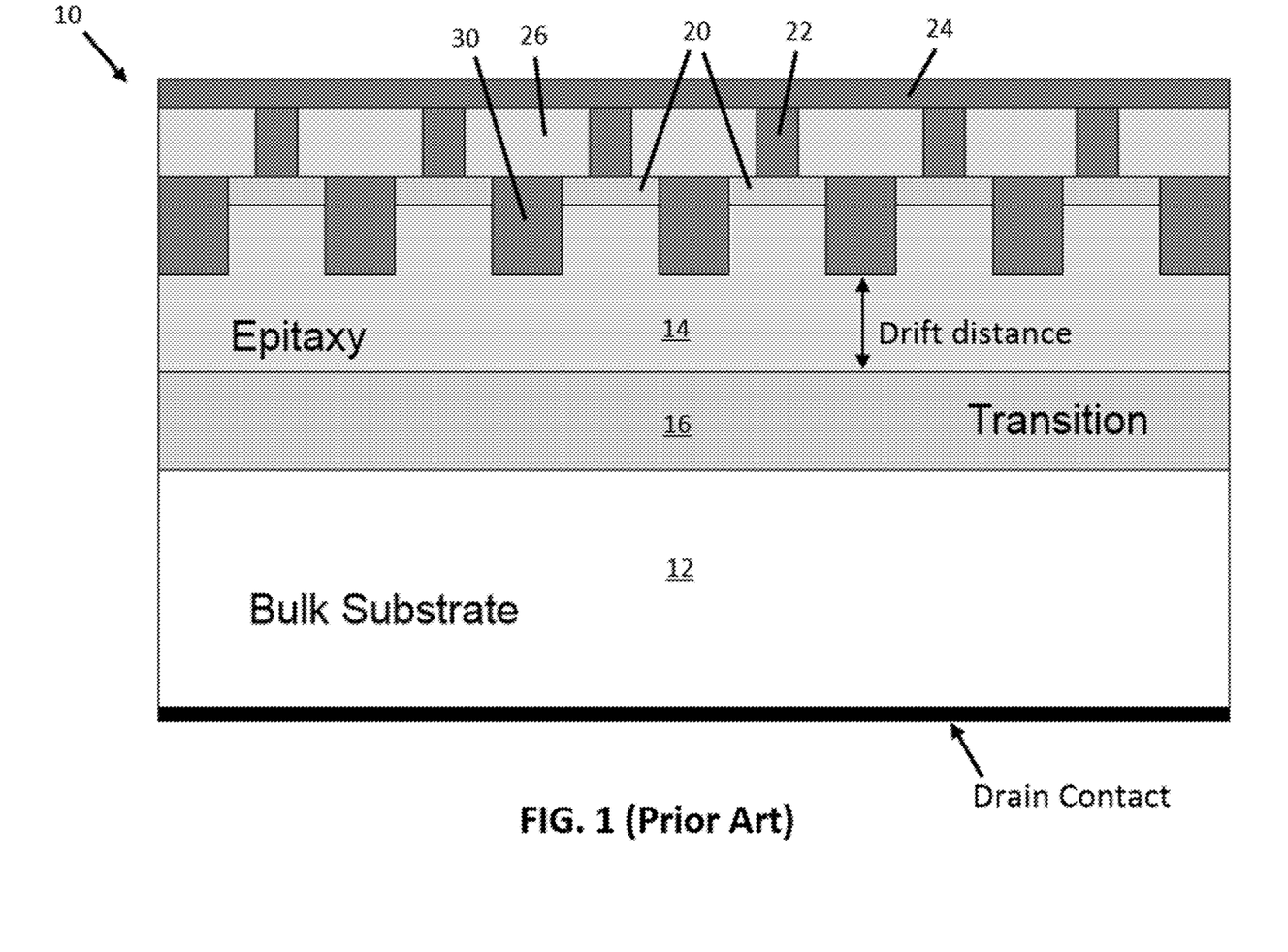
FIG. 1 illustrates a known integrated circuit (IC) structure including a number of trench-based semiconductor device, more specifically, trench FETs.

FIG. 1 illustrates a known integrated circuit (IC) structure 10 including a number of trench-based semiconductor device, more specifically, trench FETs. The example IC structure 10 includes a highly-doped bulk silicon substrate 12, a lightly-doped epitaxy (EPI) layer 14 formed over bulk substrate 12, and a transition region 16 between EPI layer 14 and bulk substrate 12. Transition region may define a transition from the more lightly doped EPI layer 14 to the more heavily doped bulk substrate region 12. The more lightly doped region may be light enough to survive a breakdown field. The resistance of this region may have consequences for operation of the FET because this area is typically not a pure metal.

Doped source regions 20 may be formed in a top portion of EPI layer 14, and poly gates 30 may be deposited in trenches formed in EPI layer 14. An oxide or insulation layer 26 may be formed over the EPI layer 14, and source contacts 22 and gate contacts (not shown) may be formed on the top or front-side of the wafer to connect the source regions 20 and poly gates 30 to conductive elements at the top or front-side of the wafer, e.g., an overlying metal layer 24 connected to source contacts 22 and/or front-side gate contacts (not shown). Drain contacts may be located on the bottom or back-side of the wafer, as indicated in FIG. 1, to define a number of vertical trench FETs. This type of vertical FET may offer better density when compared with lateral FETs. A thin back grind may be used to reduce parasitic resistance.

Figure 2:
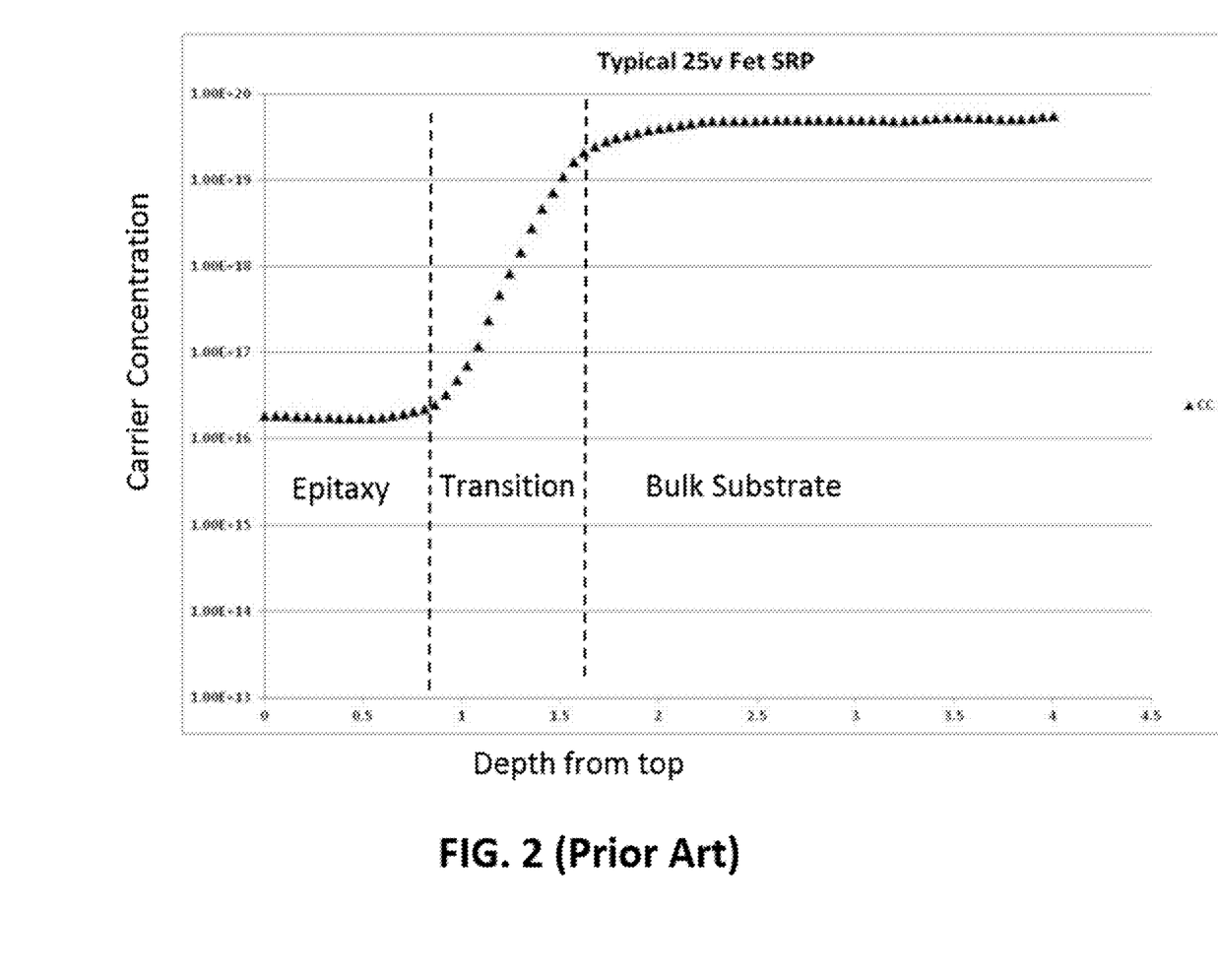
FIG. 2 illustrates the performance, in particular the carrier concentration versus depth, of the epitaxy region, transition region, and bulk substrate of the known IC structure of FIG. 1.

FIG. 2 illustrates the performance of the epitaxy region 14, transition region 16, and bulk substrate 12 in terms of carrier concentration versus depth. The left, flat portion of the curve represents electrical performance in the EPI 16, the rising part of the curve represents electrical performance in the transition region 14, and the right, flat portion of the curve represents electrical performance in the bulk region 12. In some structures, the bulk region 12 may be 50 to 150 microns thick, and the transition 16 may approximately one micron thick. For a typical 25 volt FET, the die area might be about 7 mm$^2$, and generate a total of 0.5 mohm, including resistance of 0.29 mohm for the back grind and 0.2 mohm for the transition.

SUMMARY

Embodiments of the present disclosure provide semiconductor devices having front-side source and drain contacts. Some embodiments provide trench field-effect transistors (FETs) FETs having front-side drain contacts, and may include a drift region defined in an epitaxy region (EPI) and not passing through an underlying bulk substrate or transition region, if present. Some embodiments include an integrated circuit (e.g., microchip) including one or more such FETs having front-side drain contacts, which may allow for flip-chip style mounting/packaging of the integrated circuit (e.g., microchip).

In some embodiments, the front-side drain contact may be formed in a trench formed within or through a poly gate trench formed in the EPI layer. The depth of the drain contact trench, and thus the drain contact formed in such trench, may be selectively set and the concentration of doping associated with the trench or adjacent structures may be selected to provide a desired breakdown voltage of the resulting FET. In addition, in some embodiments, the device might eliminate a transition area of epitaxy (EPI) doped silicon present in existing trench FETs. The elimination of such a transition area may remove resistance associated with the transition area.

One embodiment provides an apparatus including a plurality of semiconductor devices, wherein each semiconductor device includes an epitaxy layer, a doped source region formed in the epitaxy layer, a front-side source contact coupled to the doped source region, a trench formed in the epitaxy layer, a front-side drain contact extending into the trench formed in the epitaxy layer, and a poly gate formed in the epitaxy layer, wherein a drift region is defined between the poly gate and the front-side drain contact.

In one embodiment, each semiconductor device comprises a trench field-effect transistor (FET).

In one embodiment, the device further includes a front-side gate contact.

In one embodiment, a depth of the drain contact defines a breakdown voltage of the semiconductor device.

In one embodiment, the drain contact is located above a bulk substrate region of the device.

In one embodiment, the drain contact does not extend into the bulk substrate region.

In one embodiment, the drain contact is located above a transition region between the epitaxy layer and a bulk substrate region.

In one embodiment, the drain contact does not extend into the transition region between the epitaxy layer and the bulk substrate region.

In one embodiment, the epitaxy layer is coupled directly to a bulk substrate region, with no transition region between the epitaxy layer and bulk substrate region.

In one embodiment, the semiconductor device defines a current path from the front-side source contact to the front-side drain contact without passing through a transition layer or a bulk substrate.

In one embodiment, the semiconductor device defines a current path from the source region to the drain contact, wherein the current path is fully contained in the epitaxy layer.

In one embodiment, the drain contact is isolated from the poly gate by an oxide layer.

Another embodiment provides an apparatus including at least one field-effect transistor (FET), wherein each FET includes a substrate, an epitaxy region over the substrate, a source formed in the epitaxy region, a poly gate formed in the epitaxy region, a drain contact formed in the epitaxy region, and a current path from the source to the drain contact, wherein the current path is located in the epitaxy region and does not pass through the substrate.

In one embodiment, the apparatus includes a transition region between the epitaxy region and the substrate, wherein the current path does not pass through the transition region.

In one embodiment, the apparatus includes a front-side source contact coupled to the source; and wherein the drain contact is a front-side drain contact.

In one embodiment, the drain contact is isolated from the poly gate by an oxide layer.

In one embodiment, the source extends into the epitaxy region by a first distance, the poly gate extends into the epitaxy region by a second distance greater than the first distance, and the drain contact extends into the epitaxy region by a third distance greater than the second distance.

Another embodiment provides a method of forming a semiconductor device. The method may include forming an epitaxy (epi) region, forming a poly gate trench in the epitaxy region, forming a drain contact trench through the poly gate trench and extending to a further depth in the epitaxy region than the poly gate trench, forming a poly gate in the poly gate trench, forming a front-side drain contact in the drain contact trench, wherein the front-side drain contact is contained in the epitaxy region, and forming a source region in the epitaxy region adjacent the poly gate, and wherein a drift region is defined from an intersection of the poly gate and source region to the front-side drain contact.

In one embodiment, the front-side drain contact in the drain contact trench is isolated from each of the at least one poly gate by a respective insulating spacer.

In one embodiment, the drift region is fully contained in the epitaxy layer.

In one embodiment, the method includes forming a bulk substrate, and forming the epitaxy region over the bulk substrate, wherein the drift region does not extend into the bulk substrate.

In one embodiment, the method includes forming the epitaxy region direct on the bulk substrate such that the epitaxy region is directly coupled to the bulk substrate.

In one embodiment, the method includes forming a bulk substrate, and forming or defining a transition region between the epitaxy region and the bulk substrate, wherein the drift region does not pass extend into the transition region.

In one embodiment, the method includes forming a pair of poly gates in the poly gate trench, and forming the front-side drain contact in the drain contact trench such that the front-side drain contact extends between the pair of poly gates in the poly gate trench.

In one embodiment, the method includes forming a respective insulating spacer between the front-side drain contact and each of the pair of poly gates.

In one embodiment, the semiconductor device comprises a trench field-effect transistor (FET).

Another embodiment provides a method of forming a trench field-effect transistor (FET). The method may includes forming an epitaxy region, forming a source region in the epitaxy region, forming a front-side source contact coupled to the source region, forming a poly gate in the epitaxy region, and forming a front-side drain contact in the epitaxy region, wherein a current path is defined from the source to the drain contact, wherein the current path is located in the epitaxy region.

In one embodiment, the method includes forming a bulk substrate, and forming the epitaxy region over the bulk substrate, wherein the current path does not pass through the bulk substrate.

In one embodiment, the method includes forming a bulk substrate, and forming or defining a transition region between the epitaxy region and the bulk substrate, wherein the current path does not pass through the transition region.

In one embodiment, the source region extends into the epitaxy region by a first distance, the poly gate extends into the epitaxy region by a second distance greater than the first distance, and the drain contact extends into the epitaxy region by a third distance greater than the second distance.

In one embodiment, the method includes forming the poly gate in a poly gate trench, wherein the front-side drain contact extends through the poly gate trench, and wherein the front-side drain contact is isolated from the poly gate.

In one embodiment, the method includes forming a pair of poly gates in a poly gate trench, wherein the front-side drain contact extends between the pair of poly gates, and wherein the front-side drain contact is isolated from each poly gate by a respective insulation structure.

BRIEF DESCRIPTION OF THE FIGURES

Example aspects and embodiments are discussed below with reference to the drawings, in which.

DETAILED DESCRIPTION

Some embodiments of the present disclosure provide a semiconductor device such as a transistor, e.g., a FET, that includes a front-side (or top of the wafer) drain contact formed in an isolated trench adjacent respective poly gate(s). Thus, such a semiconductor device can be created using flip chip style packaging. Further, the depth of the drain contact trench may be variably set and the concentration of doping associated with the trench may be varied, e.g., to provide a desired breakdown voltage for each respective device. In addition, some embodiments may eliminate a transition area of epitaxy (EPI) doped silicon, which may remove or reduce resistance.

Some embodiments provide electrical device or apparatus that includes any number of such semiconductor devices, e.g., trench FETs, according to the present disclosure.

Figure 3:
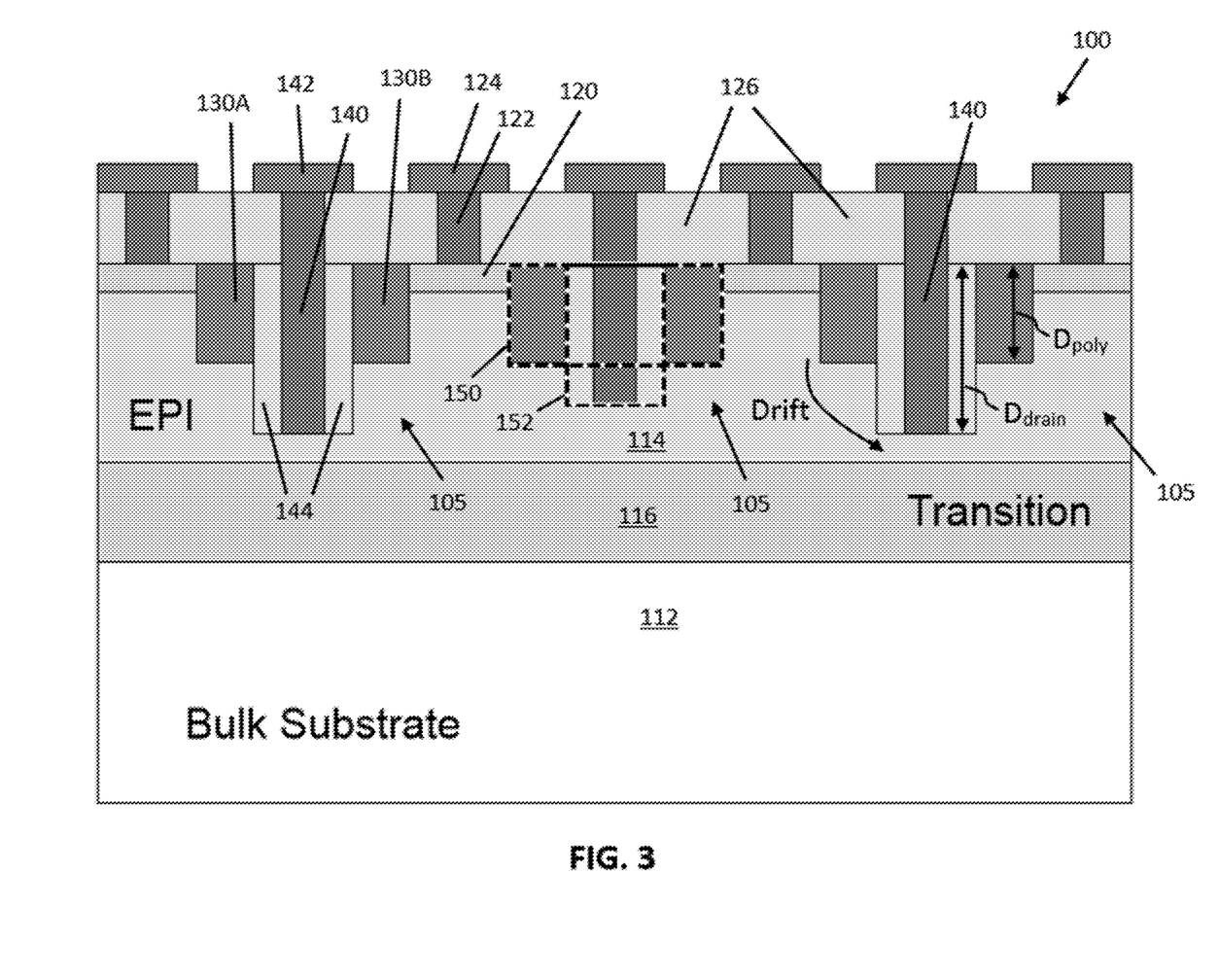
FIG. 3 illustrates an example integrated circuit (IC) structure including a number of trench-based semiconductor devices, in particular trench FETs, having front-side source and front-side drain contacts, according to one example embodiment.

FIG. 3 illustrates an example integrated circuit (IC) structure 100 including a number of semiconductor devices 105, in particular trench FETs 105, having front-side source and front-side drain contacts, according to one example embodiment. Example IC structure 100 may include a bulk substrate 112, an epitaxy (EPI) layer 114 formed over substrate 112, and a transition region 116 between EPI layer 114 and substrate 112. Substrate 112 may be a highly-doped (e.g., concentration of about $3 \times 10^{19}/cm^3$) bulk silicon substrate, EPI layer 114 may be a lightly-doped (e.g., concentration of about $3 \times 10^{16}/cm^3$) epitaxy layer, e.g., silicon epitaxy, grown or deposited over substrate 112, and transition region 116 may define a transition between from the lightly-doped EPI layer 114 to the more heavily doped bulk substrate region 112. Other embodiments may exclude transition region 116, such that EPI is directly coupled on bulk substrate 112 (which may be formed as a lightly-doped region), or may alternative exclude both transition region 116 and bulk substrate 112.

A number of doped source regions 120 may be formed in a top portion of EPI layer 114, and poly gates 130A, 130B may be formed in trenches formed in EPI layer 114. However, in contrast with the known IC structure 10 shown in FIG. 1, IC structure 100 includes a number of drain contacts 140 extending down into the poly gate trenches and up to the top or front side of the wafer, to define front-side drain contacts 140, as opposed to the back side drain contacts used in known device 10.

As shown in FIG. 3, each front-side drain contact 140 may extend into a drain trench 152 formed in the poly gate trench, indicated at 150. In the illustrated embodiment, each front-side drain contact 140 essentially "splits" the poly gate of the known structure (e.g., poly gate 30 shown in FIG. 1) to define a pair of poly gates 130A, 130B in each poly gate trench 150. Thus, drain contacts 140 may be referred to as "split trench" front-side drain contacts, and the FET 105 corresponding to each drain contact 140 may be referred to as a "split trench FET." Each drain contact 140 may be electrically isolated from poly gates 130A and 130B by insulator regions 144, e.g., oxide regions.

As shown in FIG. 3, each drain contact 140 may be formed (e.g., by forming a drain trench 152 within poly gate trench 150) to extend to a further depth than the adjacent poly gate(s) 130A, 130B, to thereby define a drift field or drift region between the gate-source junction defined between poly gate 130A or 130B and an adjacent source 120 to the bottom of front-side drain contact 140 exposed to EPI layer 114, as indicated by the label "Drift" in FIG. 3. In some embodiments, this drift region may be completely contained within the EPI region 114. Thus, in some embodiments, the drift region of each FET 105 does not extend into bulk substrate region 112, and may also not extend into transition region 116 (in embodiments that include a transition region).

As used herein, a "trench" may refer to an opening having any cross-section shape and any shape from a top-down view. For example, with reference to the various trenches shown in FIGS. 3 and 4, each trench may have (a) an elongated shape extending in a direction into the page (i.e., perpendicular to the cross sections shown in FIGS. 3 and 4), to define a linear or otherwise elongated trench shape in a cross-section taken from a top-down view, or (b) a generally circular or square cross-section taken from a top-down view (i.e., perpendicular to the cross sections shown in FIGS. 3 and 4), to define generally circular or square-shaped localized holes in the epitaxy layer, or (c) any other suitable shapes in the cross-sections shown in FIGS. 3 and 4 or in cross-sections perpendicular to the illustrated cross-section (e.g., from a top-down view).

An insulation layer 126, e.g., oxide layer, may be formed over the EPI layer 114. Front-side source contacts 122 coupled to source regions 120, and front-side gate contacts 140 may extend vertically through insulation layer 126. Front-side source contacts 122 may be coupled to front-side source conductors 124, e.g., source metal layer (e.g., aluminum or copper), and front-side drain contacts 140 may be coupled to front-side drain conductors 142, e.g., drain metal layer (e.g., aluminum or copper). Front-side source contacts 122, front-side drain contacts 140, front-side source conductors 124, and front-side drain conductors 142 may be formed from any suitable metal or other conductive material. In one embodiment, front-side source contacts 122 and front-side drain contacts 140 comprise tungsten (W), and front-side source conductors 124 and front-side drain conductors 142 comprise copper (Cu). Top or front-side gate contact(s) (not shown) may also be provided according to known techniques and structures.

The depth of drain contact 140, indicated as $D_{drain}$, may set a drift length. A breakdown voltage (BVD) for each FET 105 may be defined based on the doping concentration of EPI region 114, and the drain contact depth $D_{drain}$ relative to the depth of EPI region 114 and/the poly gate depth $D_{poly}$. Thus, the depth of drain contact 140 for each respective FET 105 may be set to provide a desired BVD for the respective FET 105. Thus, in some embodiments, a contiguous semiconductor structure including multiple FETs sharing a common substrate and/or EPI layer may include multiple drain contacts with different depths. For example, the example semiconductor structure 100 includes multiple FETs 105 sharing a common bulk substrate 112 and EPI layer 114, with drain contacts 140 having different depths that provide different breakdown voltages.

As noted above, the FET drift region for each FET 105 may be completely contained within the EPI region 114. By eliminating the current passing through the transition region and/or bulk region to a backside drain (as in the known device shown in FIG. 1), resistance in such regions may be avoided. Thus, in some embodiments, the transition region 114 and/or the bulk region 166 may be eliminated altogether. In other embodiments, depending upon the desired voltage, a transition region may be eliminated, and a lightly doped bulk region maintained.

Thus as additional drain contact may be added to the frontside of the wafer. The current may flow from the gate-source junction, within the EPI layer, to the drain contact. The result may be that parasitic resistance is eliminated. Flip chip packaging might be used. This design may provide substantially better density than lateral FET devices.

Figure 4A:
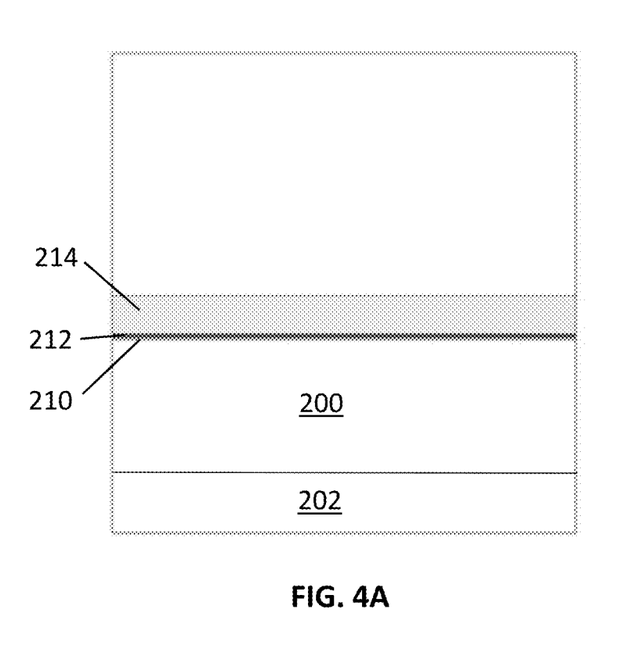
FIGS. 4A-4Q illustrate an example method of forming an IC structure including a at lest one trench FET having a front-side drain contact, e.g., the example IC structure shown in FIG. 3, according to one example embodiment.
Figure 4B:
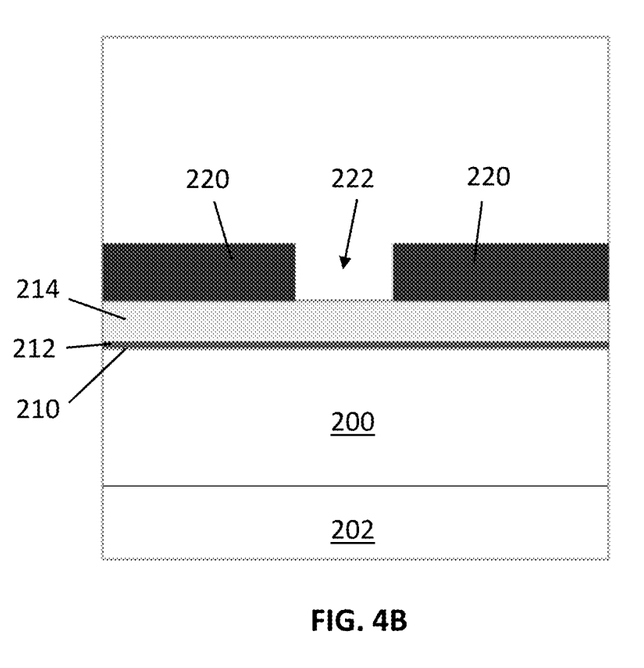
Figure 4C:
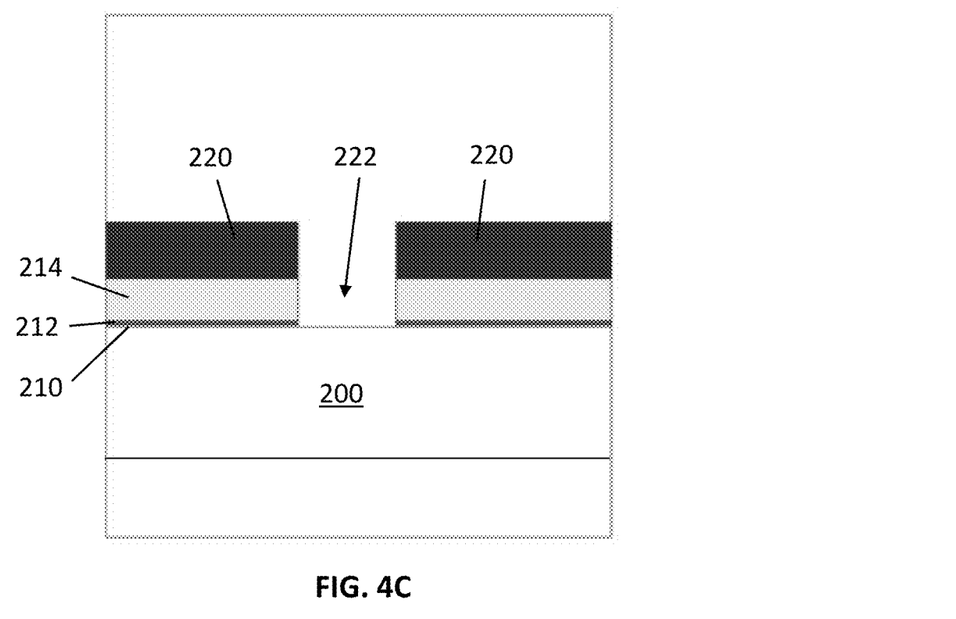
Figure 4D:
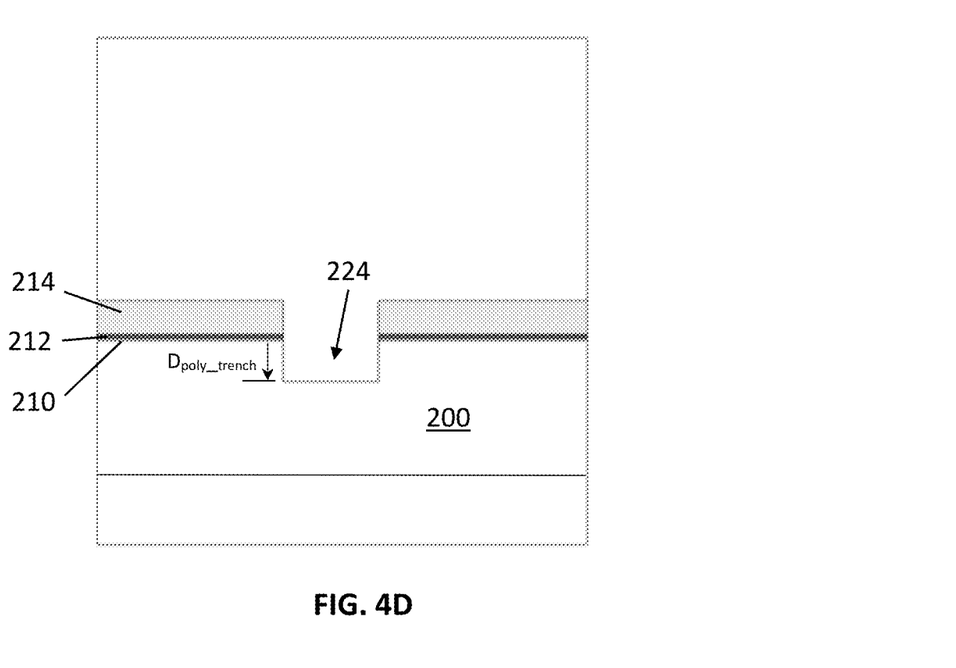
Figure 4E:
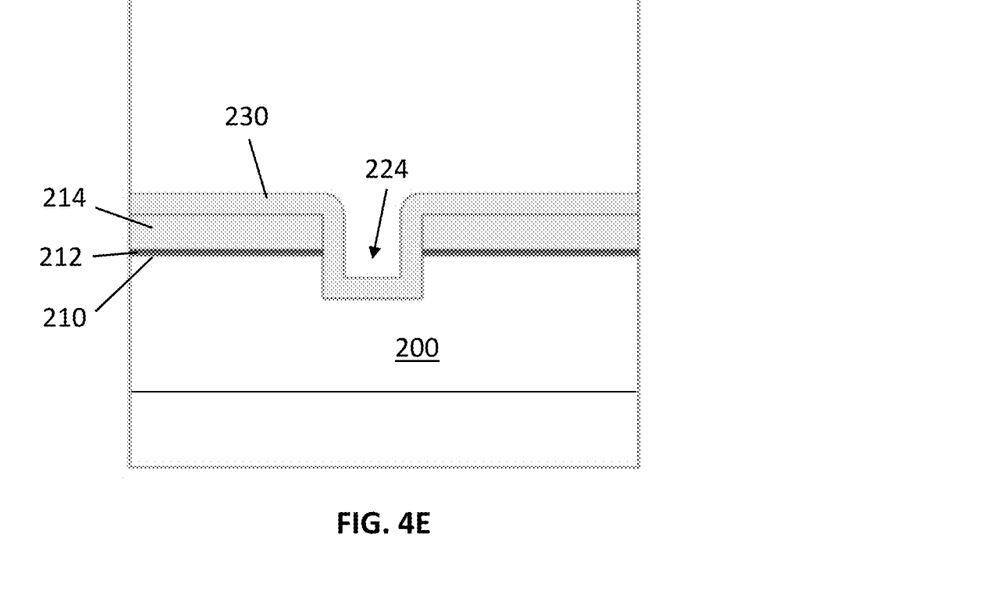
Figure 4F:
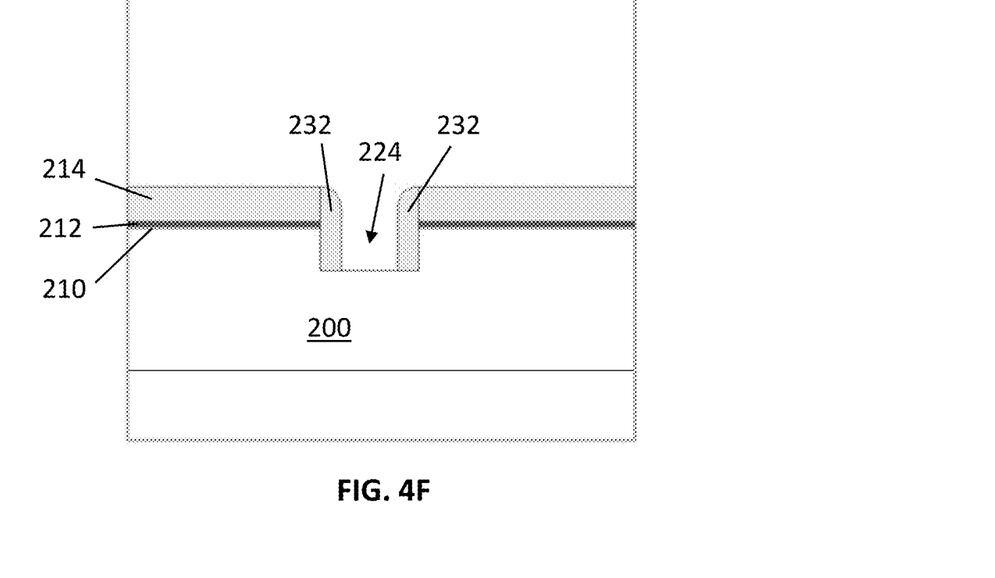
Figure 4G:
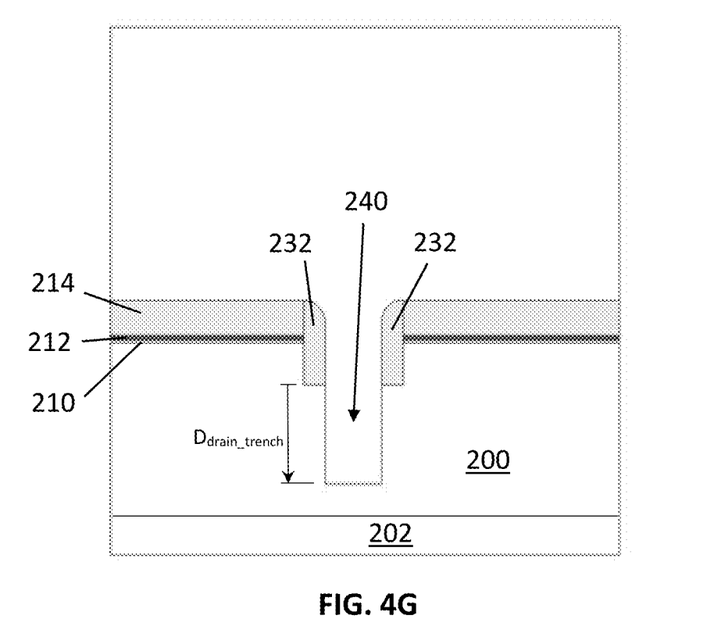
Figure 4H:
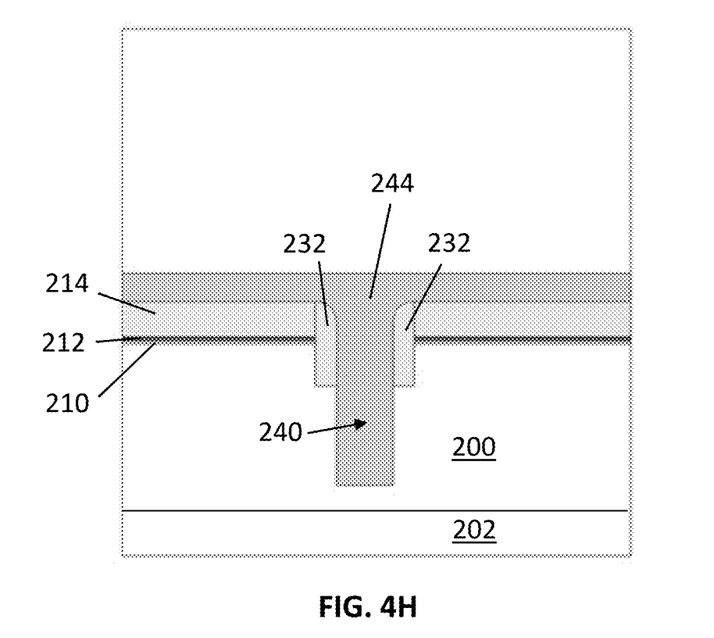
Figure 4I:
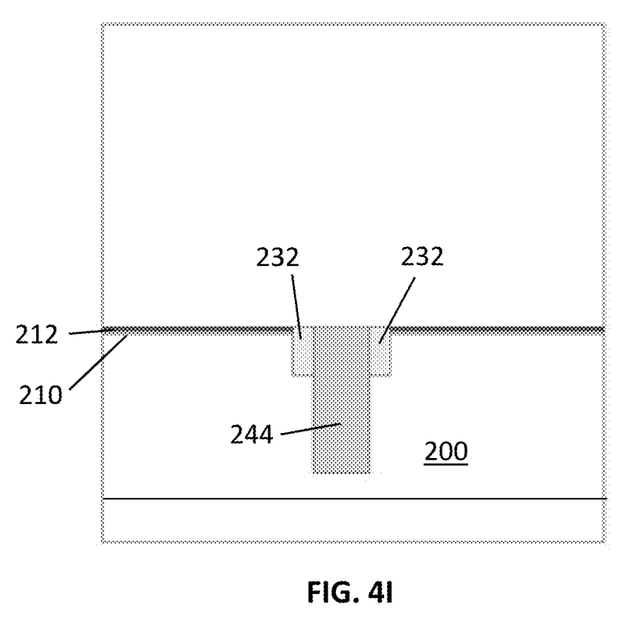
Figure 4J:
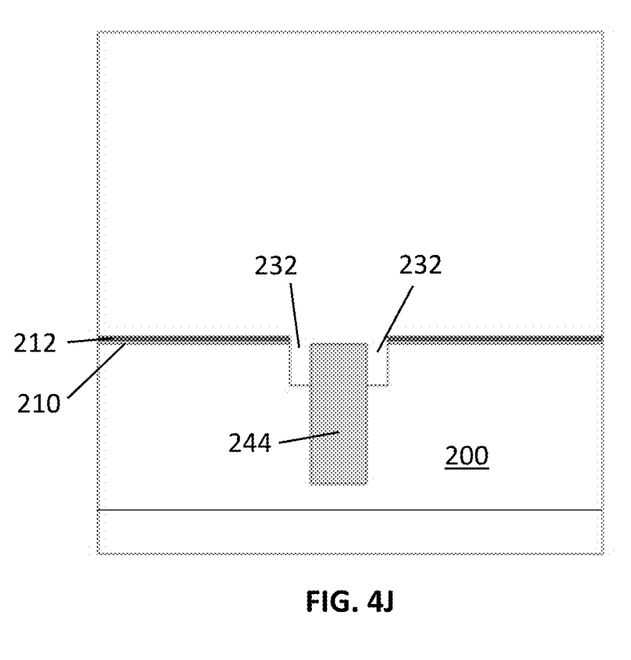
Figure 4K:
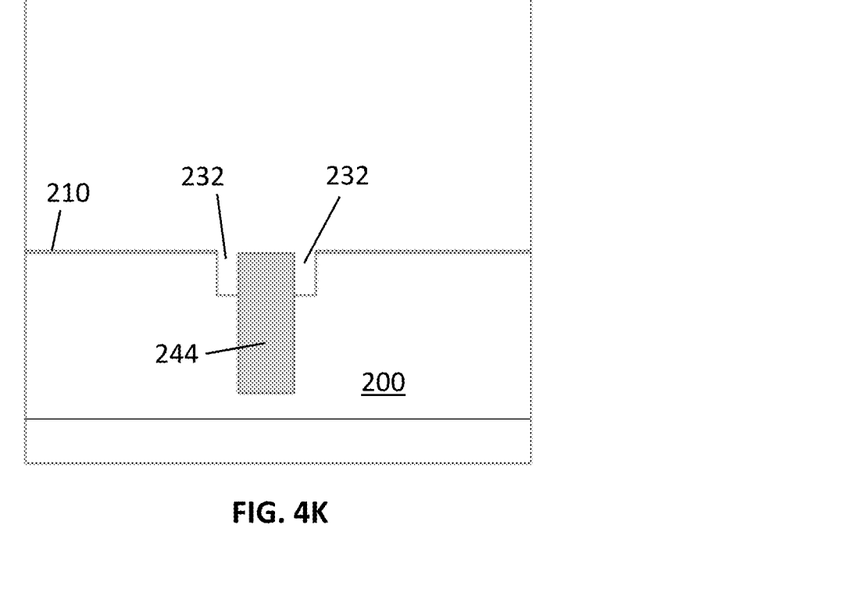
Figure 4L:
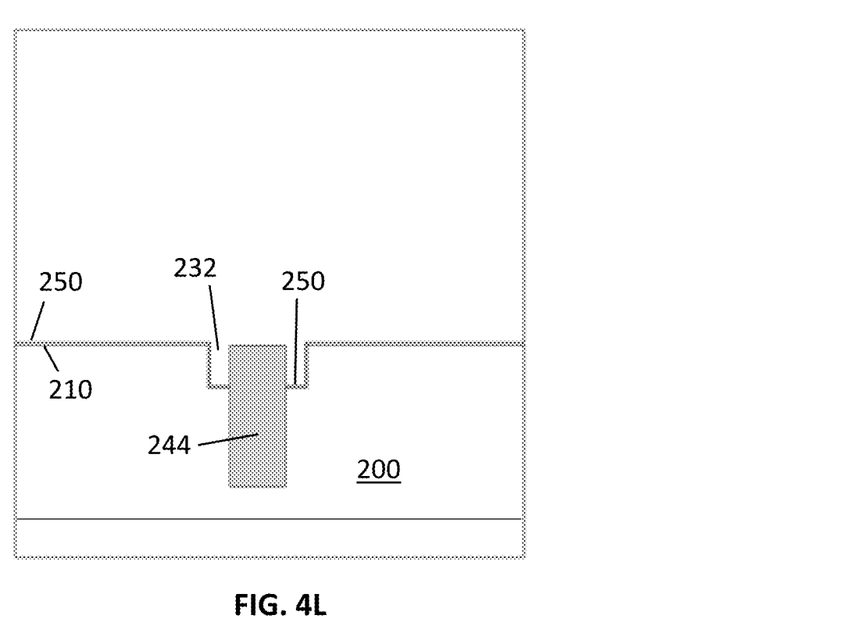
Figure 4M:
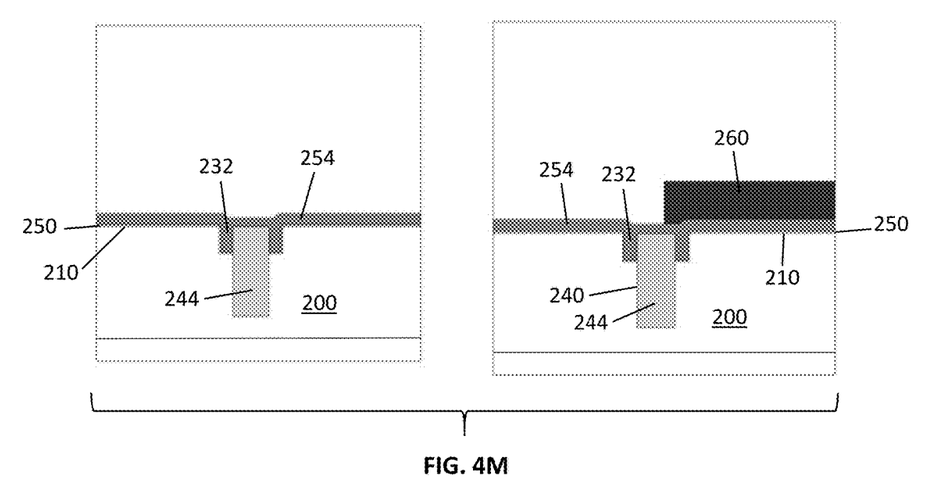
Figure 4N:
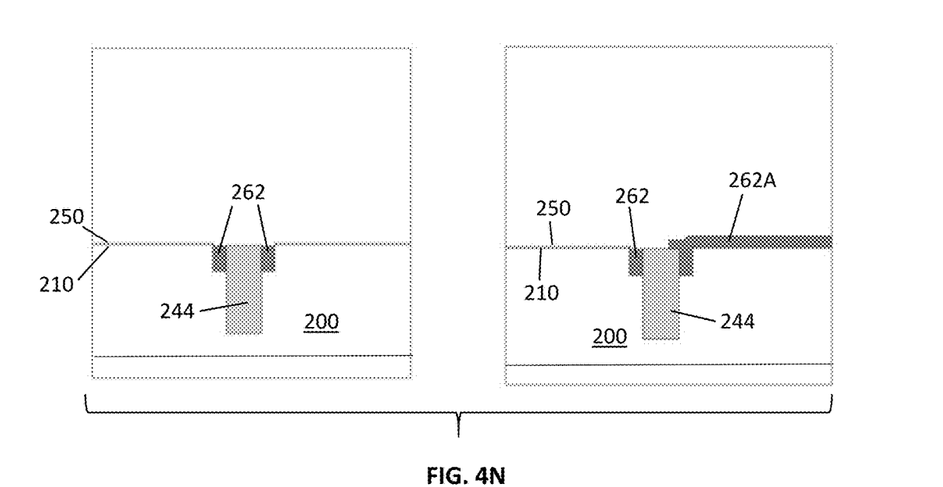
Figure 4O:
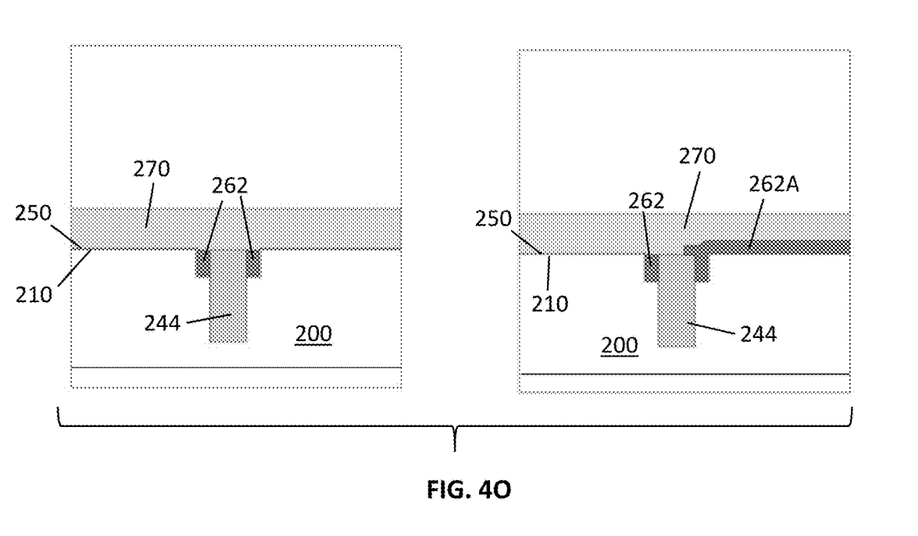
Figure 4P:
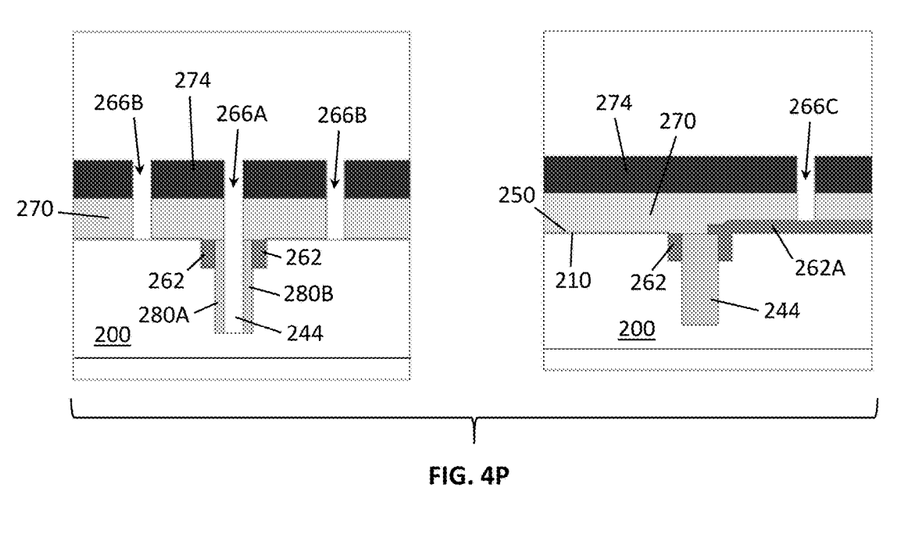
Figure 4Q:
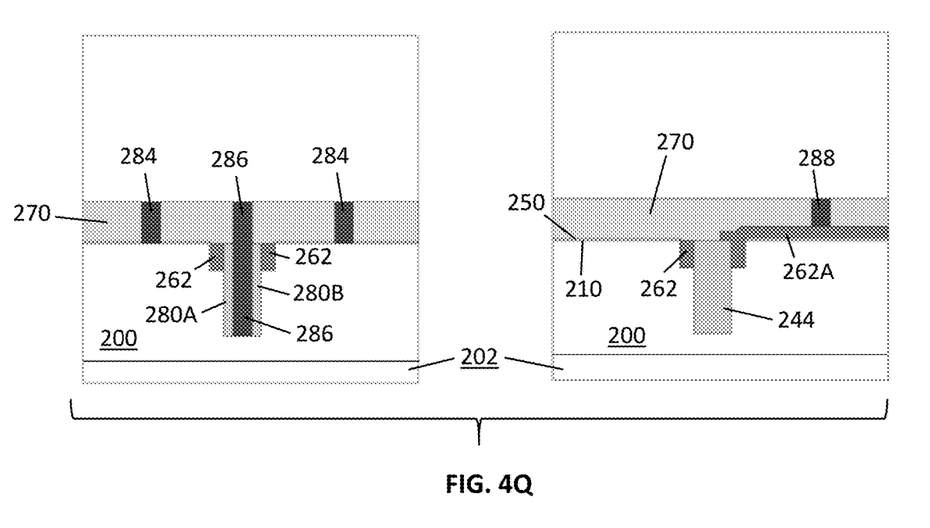

FIGS. 4A-4Q illustrate an example method of forming a semiconductor device including one or more trench FETs having front-side source contacts and front-side drain contacts, e.g., "split trench" FETs 105 shown in FIG. 3, according to one example embodiment.

As shown in FIG. 4A, an epitaxy layer (EPI) 200 may be formed over one or more base layers 202, e.g., a bulk silicon substrate and/or a transition layer, e.g., as discussed above regarding the embodiment of FIG. 3. Other embodiments may exclude base layers 202. A screen oxide layer 210 may be formed (e.g., grown) on top of EPI layer 200, and a nitride layer 212 may be deposited over oxide layer 210. A hard mask oxide layer 214 may then be deposited over the nitride layer 212.

As shown in FIG. 4B, a mask 220 (e.g., photoresist) may be formed with a trench 222.

As shown in FIG. 4C, at least one etch may be performed through trench 222 to remove portions of mask oxide layer 214, nitride layer 212, and oxide layer 210 in the trench 222, to thereby expose a top surface of EPI 200 in the trench.

As shown in FIG. 4D, photomask 220 may be removed (e.g., stripped), and an oxide-selective etch may be performed to etch a poly gate trench 224 in the EPI layer 200, to a depth indicated as $D_{poly\_trench}$. For example, poly gate trench 224 may be etched to a depth $D_{poly\_trench}$ of between 0.3 microns and 1.0 micron, e.g., about 0.6 microns.

As shown in FIG. 4E, a spacer oxide layer 230 may be deposited over the structure and extending into gate poly trench 224. As shown below, the thickness of spacer oxide layer 230 may subsequently define the thickness of poly gates 262 of the resulting device. The lower the thickness of spacer oxide layer 230 (which defines the poly gate thickness), the lower the parasitic capacitance of the resulting device. In some embodiments, the spacer oxide layer 230 thickness may between 1000 Å and 3000 Å.

As shown in FIG. 4F, a vertical spacer etch may be performed to remove portions of spacer oxide layer outside poly gate trench 224 and at the bottom of poly gate trench 224, to thereby define a pair of oxide spacers 232 on the sidewalls of trench 224.

As shown in FIG. 4G, an oxide-selective trench etch may be performed to form a drain contact trench 240 in EPI layer 200, to a depth indicated as $D_{drain\_trench}$. For example, drain contact trench 240 may be etched to a depth $D_{draintrench}$ of between 1.0 micron and 2.0 microns, e.g., about 1.4 microns. As discussed above, the depth $D_{drain\_trench}$ may be selected, along with doping concentrations in the device (e.g., doping concentration of EPI 200), to define a desired breakdown voltage of the resulting device, e.g., FET. In general, the deeper the $D_{drain\_trench}$ etch, the higher the breakdown voltage of the resulting device.

As shown in FIG. 4H, a layer of silicon-rich oxide (SRO) 244 may be deposited to fill drain contact trench 240.

As shown in FIG. 4I, a chemical mechanical planarization (CMP) process may be performed down to the nitride layer 212.

As shown in FIG. 4J, an etch may be performed to remove the remaining portions of oxide spacers 232 in trench 224. In one embodiments, the etch may comprise an oxide etch selective to SRO 244, which etches oxide spacers 232 faster than SRO 244 in trench 240.

As shown in FIG. 4K, nitride layer 212 may be removed, e.g., by performing a wet etch.

As shown in FIG. 4L, a thermal oxide (Tox) layer 250 may be grown on all exposed silicon surfaces. In some embodiments, Tox layer 250 may be grown with a thickness of between 100 Å and 500 Å, e.g., about 250 Å. The thickness of Tox layer 250 may be selected for the respective gate drive requirements of the resulting device.

Each of FIGS. 4M through 4Q shows two selected regions of the example semiconductor structure, specifically, the left side of each figure shows an example interior region of the structure while the right side of each figure shows an example lateral edge region of the structure.

As shown in FIG. 4M, a poly layer 254 may be deposited over the structure. In some embodiments, poly layer 254 may have a thickness of between 1000 Å and 3000 Å, e.g., about 2000 Å. The thickness of poly layer 254 may depend on the poly gate thickness as defined by the thickness of the previously deposited spacer oxide layer 230. Poly layer 254 may be doped, e.g., using a phosphorous oxychloride (POCl$_3$) doping, e.g., an n-type furnace doping process. As shown in the right side of FIG. 4M, a photoresist 260 may be formed over an edge of the structure, e.g., extending partially over a drain contact trench 240 near the edge of the structure.

As shown in FIG. 4N, a poly etch may be performed to remove portions of poly layer 254, to thereby define poly gates 262 and a poly gate with a lateral gate contact 262A at the lateral edge of the structure. The photoresist 260 over lateral gate contact 262A may be removed, e.g., stripped.

As shown in FIG. 4O, a pre-metal dielectric (PMD) oxide 270 may be deposited, and a CMP performed.

As shown in FIG. 4P, a mask layer 274 may be deposited and patterned to form (a) a drain contact trench 266A aligned with drain contact trench 240 and extending through the middle of SRO 244 within trench 240, to define a pair of SRO spacers 280A and 280B on opposing sides of drain contact trench 266A, (b) source contact trenches 266B on either side of drain contact trench 240, and (c) a gate contact trench 266C over gate contact 262A.

As shown in FIG. 4Q, the trenches formed in FIG. 4P may be filled with conductive material, e.g., tungsten. Drain contact trench 266A may be filled to form a front-side drain contact 286 between SRO spacers 280A and 280B, source contact trenches 266B may be filled to form front-side source contacts 284 coupled to underlying doped source regions (not shown) in EPI layer 200, and gate contact trench 266C may be formed to define a gate contact 288 coupled to gate contact 262A.

From the point shown in FIG. 4Q, known processes may be performed to form metal layers or other conductive contacts that connect to front-side drain contact 286 and front-side source contacts 284, as desired.

The invention claimed is:

1. A method of forming a semiconductor device, the method comprising:
   forming an epitaxy region;
   forming a poly gate trench in the epitaxy region;
   forming a drain contact trench through the poly gate trench and extending downwardly to a further vertical depth in the epitaxy region than the poly gate trench;
   forming a poly gate in the poly gate trench after forming the drain contact trench;
   forming a gate contact contiguous with the poly gate and extending laterally over the epitaxy region in a direction away from the poly gate trench;
   forming a front-side drain contact in the drain contact trench, wherein the front-side drain contact extends downwardly to a further vertical depth than the poly gate, but only partially through a vertical depth of the epitaxy region, such that a bottom of the front-side drain contact is located above and spaced-apart from a bottom surface of the epitaxy region; and
   forming a source region in the epitaxy region adjacent the poly gate;
   wherein a drift region extending from an intersection of the poly gate and source region to the bottom of front-side drain contact is fully contained within the epitaxy region.

2. The method of claim 1, wherein the front-side drain contact in the drain contact trench is isolated from each of the at least one poly gate by a respective insulating spacer.

3. The method of claim 1, comprising:
forming a bulk substrate; and
forming the epitaxy region over the bulk substrate;
wherein the drift region does not extend into the bulk substrate.

4. The method of claim 3, comprising forming the epitaxy region direct on the bulk substrate such that the epitaxy region is directly coupled to the bulk substrate.

5. The method of claim 1, comprising:
forming a bulk substrate; and
forming or defining a transition region between the epitaxy region and the bulk substrate;
wherein the drift region does not extend into the transition region.

6. The method of claim 1, comprising:
forming a pair of poly gates in the poly gate trench;
forming the front-side drain contact in the drain contact trench such that the front-side drain contact extends between the pair of poly gates in the poly gate trench.

7. The method of claim 6, comprising forming a respective insulating spacer between the front-side drain contact and each of the pair of poly gates.

8. The method of claim 1, wherein the semiconductor device comprises a trench field-effect transistor (FET).

9. A method of forming a semiconductor device, the method comprising:
forming an epitaxy region;
forming a poly gate trench in the epitaxy region;
depositing a sacrificial layer that extends into the poly gate trench to define sacrificial sidewalls in the poly gate trench;
forming a drain contact trench through an opening defined between the sacrificial sidewalls in the poly gate trench and extending downwardly to a further depth in the epitaxy region than the poly gate trench;
filling the drain contact trench with a drain contact trench fill material;
removing the sacrificial sidewalls in the poly gate trench to define poly gate openings in the poly gate trench;
filling the poly gate openings with poly gate material to form poly gates in the poly gate trench;
etching a drain contact opening in the drain contact trench fill material; and
filling the drain contact opening with drain contact material to form a front-side drain contact in the drain contact trench, wherein the front-side drain contact is contained in the epitaxy region; and
forming a source region in the epitaxy region adjacent the poly gate;
wherein a drift region is defined from an intersection of the poly gate and source region to the front-side drain contact.

* * * * *